United States Patent
Liu et al.

(10) Patent No.: US 12,010,352 B2
(45) Date of Patent: Jun. 11, 2024

(54) CODING METHOD AND RELATED DEVICE

(71) Applicant: HUAWEI TECHNOLOGIES CO., LTD., Guangdong (CN)

(72) Inventors: Ling Liu, Shenzhen (CN); Bin Li, Shenzhen (CN); Jiaqi Gu, Shenzhen (CN); Hui Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 183 days.

(21) Appl. No.: 17/584,726

(22) Filed: Jan. 26, 2022

(65) Prior Publication Data

US 2022/0224947 A1 Jul. 14, 2022

Related U.S. Application Data

(63) Continuation of application No. PCT/CN2020/102694, filed on Jul. 17, 2020.

(30) Foreign Application Priority Data

Aug. 15, 2019 (CN) .......................... 201910768348.8

(51) Int. Cl.
*H04N 19/93* (2014.01)
*H04N 19/184* (2014.01)
*H04N 19/91* (2014.01)

(52) U.S. Cl.
CPC ........... *H04N 19/93* (2014.11); *H04N 19/184* (2014.11); *H04N 19/91* (2014.11)

(58) Field of Classification Search
CPC ...... H04N 19/93; H04N 19/184; H04N 19/91; G06T 9/00; G06T 9/005; H03M 7/30; H03M 13/13

(Continued)

(56) References Cited

U.S. PATENT DOCUMENTS 5,825,830 A 10/1998 Kopf
6,643,408 B2 * 11/2003 Kobayashi .............. G06T 9/007
382/250

(Continued)

FOREIGN PATENT DOCUMENTS

CN 103580809 A 2/2014
CN 103581679 A 2/2014

(Continued)

OTHER PUBLICATIONS

PCT International Search Report and Written Opinion issued in International Application No. PCT/CN2020/102694 dated Oct. 22, 2020, 17 pages (with English translation).

*Primary Examiner* — Emmanuel Bayard
(74) *Attorney, Agent, or Firm* — Fish & Richardson P.C.

(57) ABSTRACT

The present disclosure provides example coding method, apparatus, and computer-readable storage medium. One example method includes sorting a plurality of pieces of run-length encoding (RLE) data based on their distribution probabilities. The plurality of pieces of sorted RLE data are mapped onto a plurality of pieces of reassembled data. The plurality of pieces of reassembled data are expanded into a plurality of pieces of binary data. A first matrix is generated based on the plurality of pieces of binary data. A code sequence is determined by processing a source signal, where the code sequence comprises a first set and a second set. A first vector is decoded to output a third set, where the third set includes one or more bits reserved after processing the source signal and one or more locations at which a decoding error occurs in one or more bits discarded after processing the source signal.

20 Claims, 12 Drawing Sheets

(58) Field of Classification Search
USPC .................................. 375/242, 246, 253
See application file for complete search history.

(56) References Cited

U.S. PATENT DOCUMENTS

| | | | |
|---|---|---|---|
| 7,424,163 B1* | 9/2008 | Ellis | H04N 19/102 |
| | | | 382/232 |
| 2007/0290908 A1* | 12/2007 | Esumi | G11B 20/10 |
| | | | 360/39 |
| 2011/0116542 A1 | 5/2011 | Oger et al. | |
| 2013/0027230 A1 | 1/2013 | Marpe et al. | |
| 2014/0040214 A1 | 2/2014 | Ma | |
| 2014/0185668 A1 | 7/2014 | Jiang et al. | |
| 2015/0350623 A1* | 12/2015 | Zhang | H04N 19/48 |
| | | | 375/240.12 |
| 2019/0260398 A1* | 8/2019 | Chaki | H03M 13/13 |

FOREIGN PATENT DOCUMENTS

| | | |
|---|---|---|
| CN | 104539393 A | 4/2015 |
| CN | 107666324 A | 2/2018 |
| CN | 109936377 A | 6/2019 |
| WO | 03067763 A2 | 8/2003 |
| WO | 2018137567 A1 | 8/2018 |

* cited by examiner

| 16 | 11 | 10 | 16 | 24 | 40 | 51 | 61 |
|----|----|----|----|----|----|----|-----|
| 12 | 12 | 14 | 19 | 26 | 58 | 60 | 55 |
| 14 | 13 | 16 | 24 | 40 | 57 | 69 | 56 |
| 14 | 17 | 22 | 29 | 51 | 87 | 80 | 62 |
| 18 | 22 | 37 | 56 | 68 | 109| 103| 77 |
| 24 | 35 | 55 | 64 | 81 | 104| 113| 92 |
| 49 | 64 | 78 | 87 | 103| 121| 120| 101|
| 72 | 92 | 95 | 98 | 112| 100| 103| 99 |

FIG. 2

| 15→0 | -1→0 | 0→0 | 0→0 |
|------|------|------|------|
| -2 | -1 | 0 | 0 | 0 | 0 | 0 | 0 |
| -1 | -1 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

FIG. 3

CODING METHOD AND RELATED DEVICE

CROSS-REFERENCE TO RELATED APPLICATIONS

This application is a continuation of International Patent Application No. PCT/CN2020/102694, filed on Jul. 17, 2020, which claims priority to Chinese Patent Application No. 201910768348.8, filed on Aug. 15, 2019. The disclosures of the aforementioned applications are hereby incorporated by reference in their entireties.

TECHNICAL FIELD

This application relates to the image processing field, and in particular, to a coding method and a related device.

BACKGROUND

Entropy coding is a coding technology widely used in image and video data compression, essence of the entropy coding is a lossless data compression scheme that is independent of specific characteristics of a medium, and no information is lost according to Shannon's entropy theorem. Common entropy coding includes Shannon coding, Huffman coding, arithmetic coding, and the like. The entropy coding aims to losslessly describe a source symbol with a code length as short as possible. At present, entropy coding is widely used in fields such as image and video compression fields, and plays a quite important role in reducing occupied storage space and improving data transmission efficiency. However, a variable-length coding scheme used in the conventional technology has a relatively low throughput and low coding efficiency.

SUMMARY

Embodiments of this application provide a coding method and a related device, to increase a compression throughput of a polar code and implement fast lossless compression of parallel polar coding.

According to a first aspect, an embodiment of this application provides a coding method. The method includes: obtaining a plurality of pieces of run-length encoding (RLE) data and distribution probabilities corresponding to the plurality of pieces of RLE data; sorting the plurality of pieces of RLE data based on the distribution probabilities, and mapping the plurality of pieces of sorted RLE data onto a plurality of pieces of reassembled data; expanding the plurality of pieces of reassembled data into a plurality of pieces of binary data, generating a first matrix, and calculating an occurrence probability of a bit 1 in each column in the first matrix based on the distribution probabilities; determining, based on the occurrence probability, a code sequence obtained by processing a source signal, where the code sequence includes a first set and a second set, the first set is a bit reserved after compression, and the second set is a bit discarded after compression; and finally decoding a first vector to output a third set, where the first vector is an all-0 sequence, or is a vector obtained by multiplying a vector corresponding to the first set and a polarization matrix, and the third set includes the bit reserved after compression and a location at which a decoding error occurs in the bit discarded after compression. Color transform, grayscale translation, discrete cosine transform (DCT) transform, data quantization, zig-zag scanning, and run-length encoding are performed on image data to obtain RLE data, the RLE data is reassembled, reassembled RLE data is converted into a multi-bit binary bit sequence, and finally a polar code is designed to perform parallel compression on a signal of each bit plane. This increases a compression throughput of the polar code and implements fast lossless compression of parallel polar coding.

In a possible design, the first set is a bit whose polarized entropy approximates to 1 in the code sequence, and the second set is a bit whose polarized entropy approximates to 0 in the code sequence.

In another possible design, the polarized entropy is determined based on the occurrence probability.

In another possible design, the decoding a first vector to output a third set includes: performing decoding based on a fixed bit set by using a polar decoder, to obtain an estimated value of the bit discarded after compression, where $Y^N=0^N$, $U_F=U_S$, $Y^N$ is a received signal of the polar decoder, $U_F$ is the fixed bit set, $U_S$ is the first set, and N is an integer greater than or equal to 1. A design of a lossless compression polar code is equivalent to a design of polar channel decoding for a binary symmetric channel. This implement fast lossless compression of the polar code.

In another possible design, the decoding a first vector to output a third set includes: performing decoding based on a fixed bit set by using a polar decoder, to obtain an estimated value of the bit discarded after compression, where $Y^N=[U_F, 0_I]*G_N$, $U_F=0_F$, $Y^N$ is a received signal of the polar decoder, $U_F$ is the fixed bit set, $G_N$ is the polarization matrix, and N is an integer greater than or equal to 1. A matrix corresponding to the fixed bit set is translated, so that the existing polar decoder is directly used. This implements fast lossless compression of parallel polar coding.

In another possible design, the decoding a first vector to output a third set includes: when the estimated value is different from an original value of the bit discarded after compression, flipping the estimated value, and recording the location at which a decoding error occurs in the bit discarded after compression.

In another possible design, the plurality of pieces of RLE data are sorted in descending order of the distribution probabilities; and then the plurality of pieces of sorted RLE data are mapped onto the plurality of pieces of reassembled data. For example, RLE data with a highest distribution probability is mapped onto 0, RLE data with a second highest probability is mapped onto 1, a third highest probability is mapped onto 2, and so on. Through data reassembly, a correlation between bits is reduced, and compression performance is improved.

In another possible design, layering is performed based on each column of the first matrix to obtain a plurality of bit planes, and the occurrence probability of 1 in each bit plane is calculated, to implement parallel layered compression of polar coding.

According to a second aspect, an embodiment of this application provides a coding apparatus. The coding apparatus is configured to implement the method and the function in the first aspect, and is implemented by hardware/software. The hardware/software of the coding apparatus includes a module corresponding to the foregoing function.

According to a third aspect, an embodiment of this application provides a network element device, including a processor, a memory, and a communications bus. The communications bus is configured to implement connection and communication between the processor and the memory, and the processor executes a program stored in the memory, to implement the steps in the first aspect.

In a possible design, a network element device provided in this application may include a corresponding module configured to perform behaviors of the network element device in the foregoing method design. The module may be software and/or hardware.

According to a fourth aspect, this application provides a computer-readable storage medium. The computer-readable storage medium stores instructions. When the instructions are run on a computer, the computer is enabled to perform the method in the first aspect.

According to a fifth aspect, this application provides a computer program product including instructions. When the computer program product runs on a computer, the computer is enabled to perform the method in the first aspect.

BRIEF DESCRIPTION OF DRAWINGS

To describe technical solutions in embodiments of this application or in the background more clearly, the following describes the accompanying drawings required for describing the embodiments of this application or the background.

FIG. 2 is a schematic diagram of a quantization matrix used in a JPEG compression algorithm according to an embodiment of this application;

FIG. 3 is a schematic diagram of a quantized frequency component according to an embodiment of this application;

DESCRIPTION OF EMBODIMENTS

The following describes the embodiments of this application with reference to the accompanying drawings in the embodiments of this application.

Figure 1:
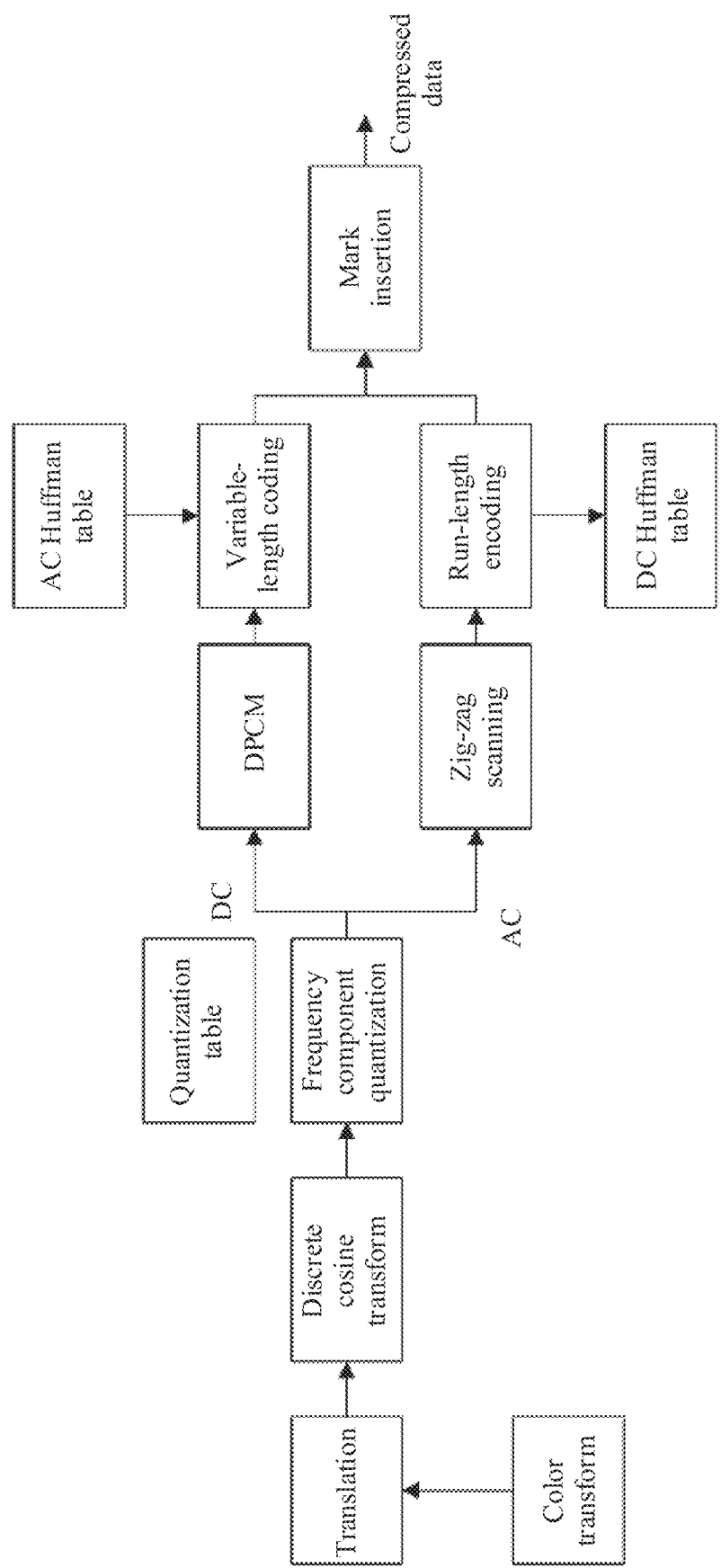
FIG. 1 is a schematic flowchart of a typical JPEG compression algorithm according to an embodiment of this application.

FIG. 1 is a schematic flowchart of a typical JPEG compression algorithm according to an embodiment of this application. For example, for Joint Photographic Experts Group (JPEG) image compression coding, color transform is first performed on an original image to obtain three grayscale matrices, that is, Y, U and V, and a grayscale range of each of the grayscale matrices is adjusted by using a corresponding level offset; then, discrete cosine transform (DCT) is performed on shifted grayscale matrices as per 8×8 small matrix blocks (0 is padded if necessary), to obtain component information of discrete frequencies; and next, quantization (uniform scalar quantization) is performed on the component information of the discrete frequencies to obtain a direct current coefficient (DC coefficient) and an alternating current coefficient (AC coefficient). FIG. 2 is a schematic diagram of a quantization matrix used in a JPEG compression algorithm according to an embodiment of this application. The direct current coefficient may be encoded through differential pulse code modulation (DPCM), and then variable-length coding is performed on data obtained through DPCM encoding, to obtain a DC bitstream. In contrast, for the alternating current coefficient, because an image signal mainly includes low-frequency components, and a human eye is more sensitive to a low-frequency component, a quantization step for quantizing the AC part is usually larger. This leads to a plurality of 0s in signals of the AC part.

FIG. 3 is a schematic diagram of a quantized frequency component according to an embodiment of this application. The alternating current coefficient is quantized, and an 8×8 matrix is converted into a sequence string through zig-zag scanning, where the sequence string is (15, 0, −2, −1, −1, −1, 0, . . . ). A trailer of the sequence string includes a plurality of consecutive 0s. To reduce occupied space, run-length encoding (RLE) may be performed on the sequence string to obtain a shorter sequence string. Specifically, an operation is performed on a digital sequence string including many consecutive 0s, and any non-0 digit a in the sequence string is encoded as two digits (N, a). N represents a quantity of consecutive 0s before a location of a digit a. For example, a sequence string (0, 0, 8, 0, 5, 5, 0, 0, 0, 6) is encoded as {(2, 8), (1, 5), (0, 5), (3, 6)}; and a sequence string (9, 0, 0, 0, 0, 4, 0, 0, 0, 0, 0, 1) is encoded as ((0, 9), (4, 4), (5, 1)). After the run-length encoding data is obtained, because probabilities of these pieces of data are different, entropy coding needs to be performed on these pieces of data to remove redundancy. Huffman coding or arithmetic coding is usually used in a system. Huffman coding is used as an example in this embodiment of this application.

Figure 4:
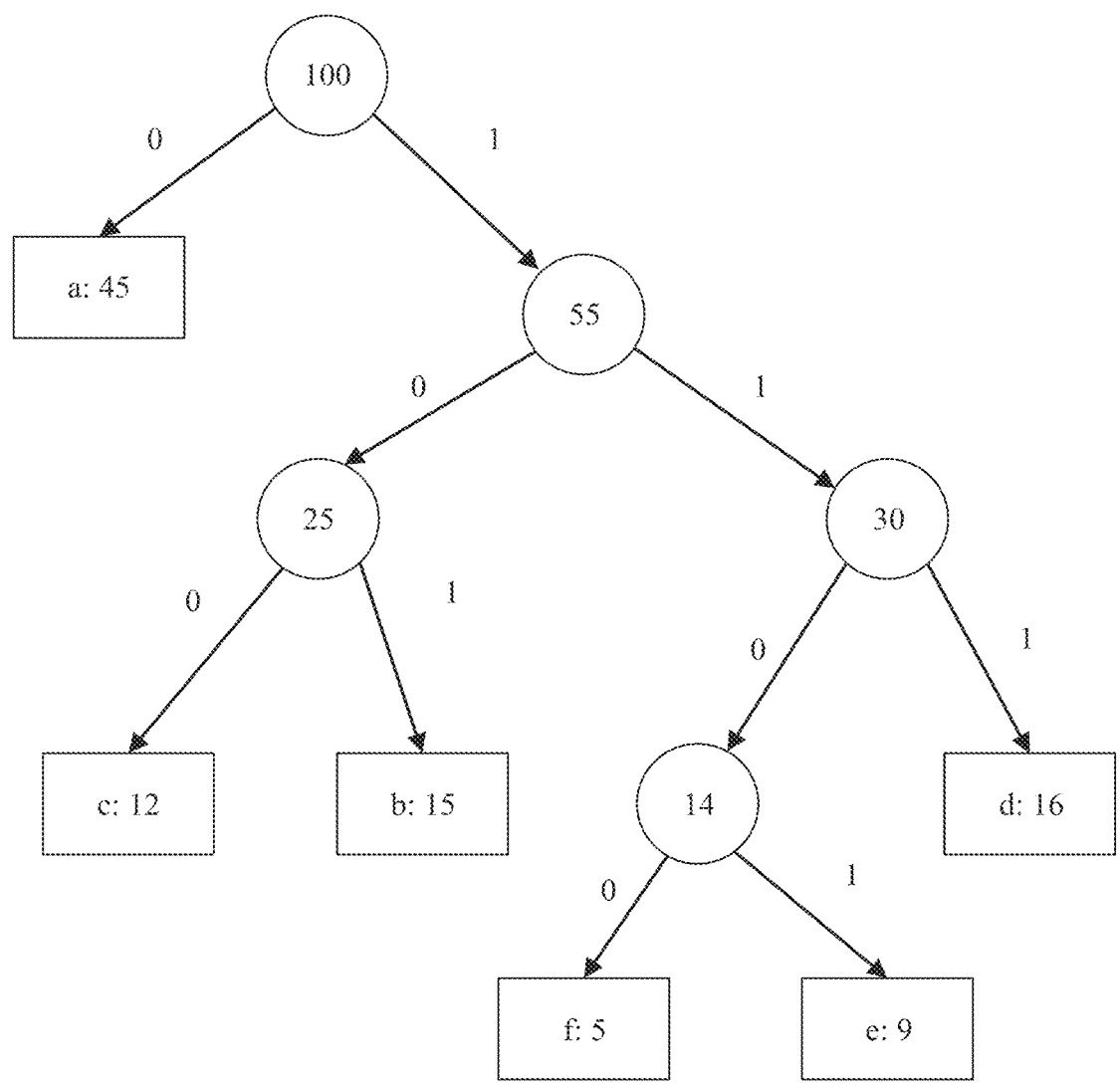
FIG. 4 is a schematic diagram of Huffman coding according to an embodiment of this application.

For conventional entropy coding schemes such as Huffman coding, run-length encoding data is considered as being independently generated from a single source based on a specific distribution. Therefore, before Huffman coding is performed, distribution probabilities of all data need to be calculated, and a corresponding dictionary needs to be generated based on the distribution probabilities by using Huffman coding. A basic principle is that a numeral with a higher distribution probability is represented by shorter binary bits, and a numeral with a lower distribution probability is represented by longer binary bits. FIG. 4 is a schematic diagram of Huffman coding according to an embodiment of this application. At a second layer, a distribution probability of a is 45%, which is greater than a distribution probability of any other piece of data, and a is encoded by using one bit, that is, represented by 0. At a fourth layer, three bits are used for coding, where b=101, c=100, and d=111. At a fifth layer, a distribution probability of f is 5% and a distribution probability of e is 9%, which are both less than distribution probabilities of other data, and f and e are encoded by using four bits, where e=1101 and f=1100. After the foregoing Huffman coding is completed, a JPEG image compression process ends.

Figure 5:
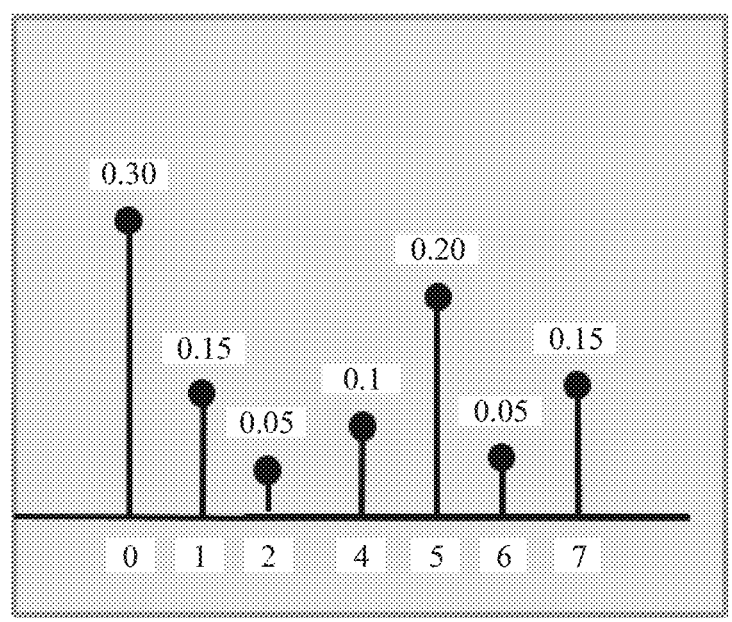
FIG. 5 is a schematic diagram of a statistical probability distribution according to an embodiment of this application.

According to the foregoing description of the run-length encoding and the entropy coding, a string of digit pairs {($N_1$, $a_1$), ($N_2$, $a_2$), ($N_3$, $a_3$), ($N_4$, $a_4$), ..., ($N_i$, $a_i$), ...} is obtained through run-length encoding, where $N_1$ represents a quantity of consecutive 0s before a digit $a_i$. In entropy coding, the quantity of 0s before the digital symbol $a_i$ that is obtained through run-length encoding is considered as signals generated from one discrete source based on a fixed distribution, and then statistics collection and compression are performed on a signal. For example, FIG. 5 is a schematic diagram of a statistical probability distribution obtained through Huffman coding according to an embodiment of this application. N={0, 1, 2} (that is, a value of $N_i$ is 0, 1, or 2), a=(0, 1, 2, 4, 5, 6, 7), and calculated occurrence frequencies of {0, 1, 2, 4, 5, 6, 7} are {0.3, 0.15, 0.05, 0.1, 0.20, 0.05, 0.15}, respectively. A dictionary obtained through Huffman coding is [00, 011, 1111, 110, 10, 1110, 010] that represents {0, 1, 2, 4, 5, 6, 7}, respectively. An average compression length implemented is 2.6 bits. Probabilities corresponding to the digits are {0.3, 0.15, 0.05, 0.1, 0.20, 0.05, 0.15}, and entropy is 2.5710. Through Huffman coding, optimal performance is nearly achieved.

The Huffman-based entropy coding is a type of variable-length coding in source compression. Because a code structure similar to a binary tree is used, and a Huffman code is a typical prefix code, that is, any code word in a codebook is not a prefix part of other code words, the Huffman-based entropy coding is a codebook mapping mode in which unique restoration can be performed without setting breakpoints. However, Huffman decoding also has a disadvantage, that is, breakpoints need to be found one by one based on the codebook in a code dictionary and a decision needs to be made. For example, as shown in FIG. 5, Huffman decoding needs to be performed on a binary sequence 0001111111101011100110. The $1^{st}$ received symbol 0 is first searched for, but does not exist in a code dictionary [00, 011, 1111, 110, 10, 1110, 010]; "00" continues to be searched for, and if a corresponding symbol is found in the dictionary, "00" is decoded as 0; a next "0" is searched for but there is no corresponding codebook, and "01" is then searched for but there is still no corresponding codebook; and then "011" is searched for, and if a corresponding symbol is found in the dictionary, "011" is decoded as 1. This process is repeated until all characters are restored.

It can be learnt that the variable-length coding has the following advantage: A symbol with a higher probability can be represented by a short code and a symbol with a lower probability can be represented by a long code, to achieve an average length, and gradually achieve optimal compression efficiency. However, bits need to be compared and searched for one by one during decoding, resulting in a relatively low throughput rate and low coding efficiency. To resolve the foregoing technical problems, the embodiments of this application provide the following solutions.

Figure 6:
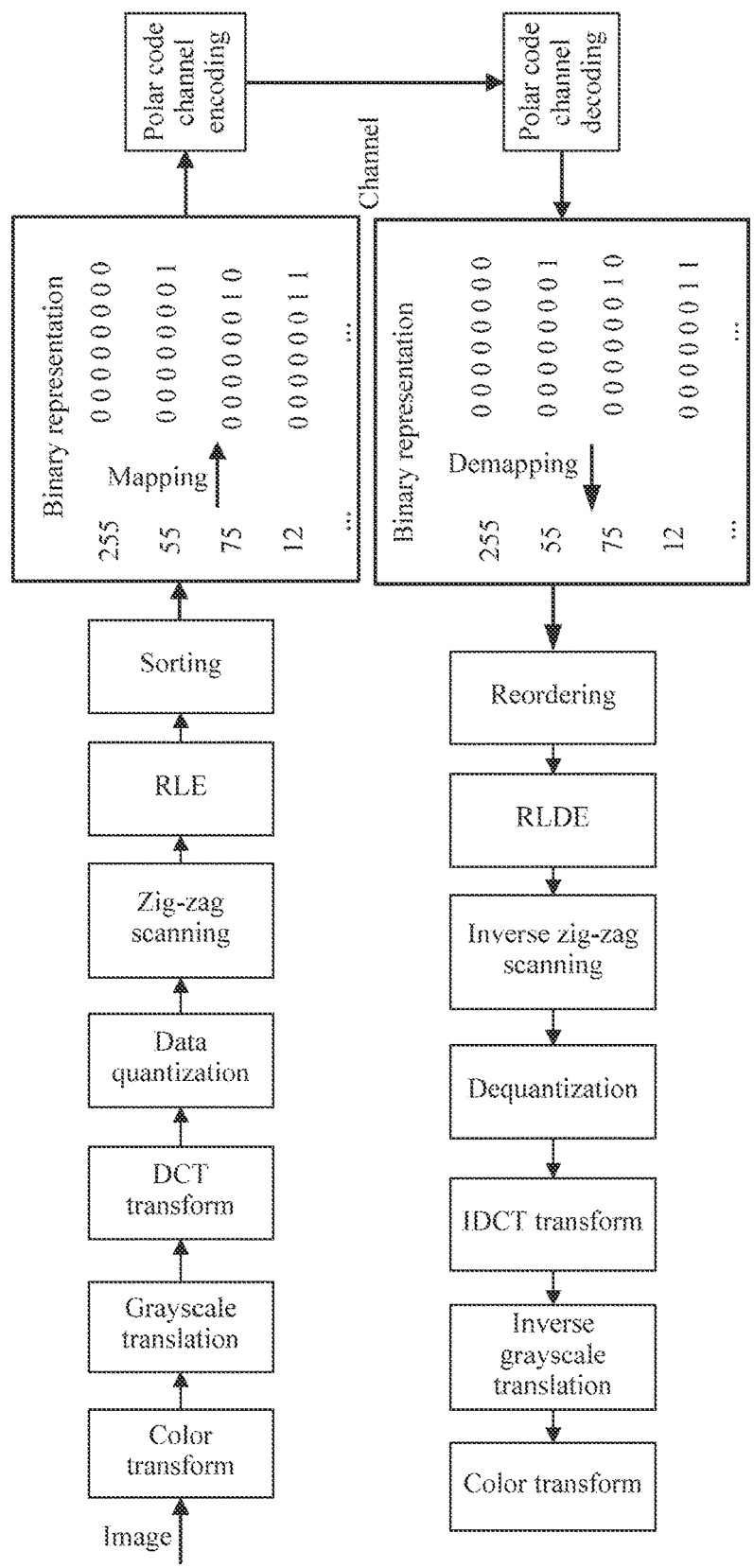
FIG. 6 is a schematic diagram of an architecture of a coding system according to an embodiment of this application.

FIG. 6 is a schematic diagram of an architecture of a coding system according to an embodiment of this application. JPEG operations such as color transform, grayscale translation, 8×8 DCT transform, data quantization, zig-zag scanning, and run-length encoding (RLE) are first performed on image data to obtain a plurality of pieces of RLE data. Then, the RLE data is sorted in descending order of probabilities to obtain a symbol set {a_1, a_2, ..., a_n}, and the corresponding probabilities of {a_1, a_2, ..., a_n} are {p_1, p_2, ..., p_n} that satisfies a relationship p_1≥p_2≥ ... ≥p_n. (a_1, a_2, ..., a_n) is respectively mapped onto {0, 1, ..., n−1} to complete data reassembly, and then reassembled data is expanded in binary natural order. For example, when n=4, if data obtained after sorting the RLE data is ('255', '55', '72', '12'), {'255', '55', '72', '12'} is mapped onto corresponding {0, 1, 2, 3}, and the mapped values are represented by a corresponding binary sequence {00000000, 00000001, 00000010, 00000011}. Occurrence probabilities of 0 and 1 at each layer (column) of the foregoing binary sequence (eight layers herein) are calculated, and parallel layered compression of polar coding is completed based on the occurrence probabilities. After each layer of compression is completed, data splicing is performed on compressed data at each layer to complete a compression process. It should be noted that an operation process of a receive end is an inverse process of the foregoing process, and details are not described herein. A specific coding process is as follows.

Fixed-length coding is used in this embodiment of this application. The fixed-length coding is a type of linear coding, in which a high-dimensional redundant source vector with a fixed length (which is assumed to be N) is compressed into a vector whose dimension is approximately NH(X), where H(X) is entropy of a source X. If X is a binary signal including 0 and 1, $H(X)=-p \log_2 p-(1-p) \log_2(1-p)$, where p is a probability that X is equal to 1. When the fixed-length coding is used, N symbols are simultaneously processed each time, and during decoding, RN compressed bits are extracted based on a fixed compression rate R to restore N original symbols (where R≥H(X)). In this case, the system has a relatively large throughput and is relatively stable, and a linear channel coding technology can be used. In this embodiment of this application, extension of a polar code in source compression is used, so that entropy coding is implemented when an existing polar code channel decoder is used in source compression, thereby improving entropy coding efficiency.

Figure 7:
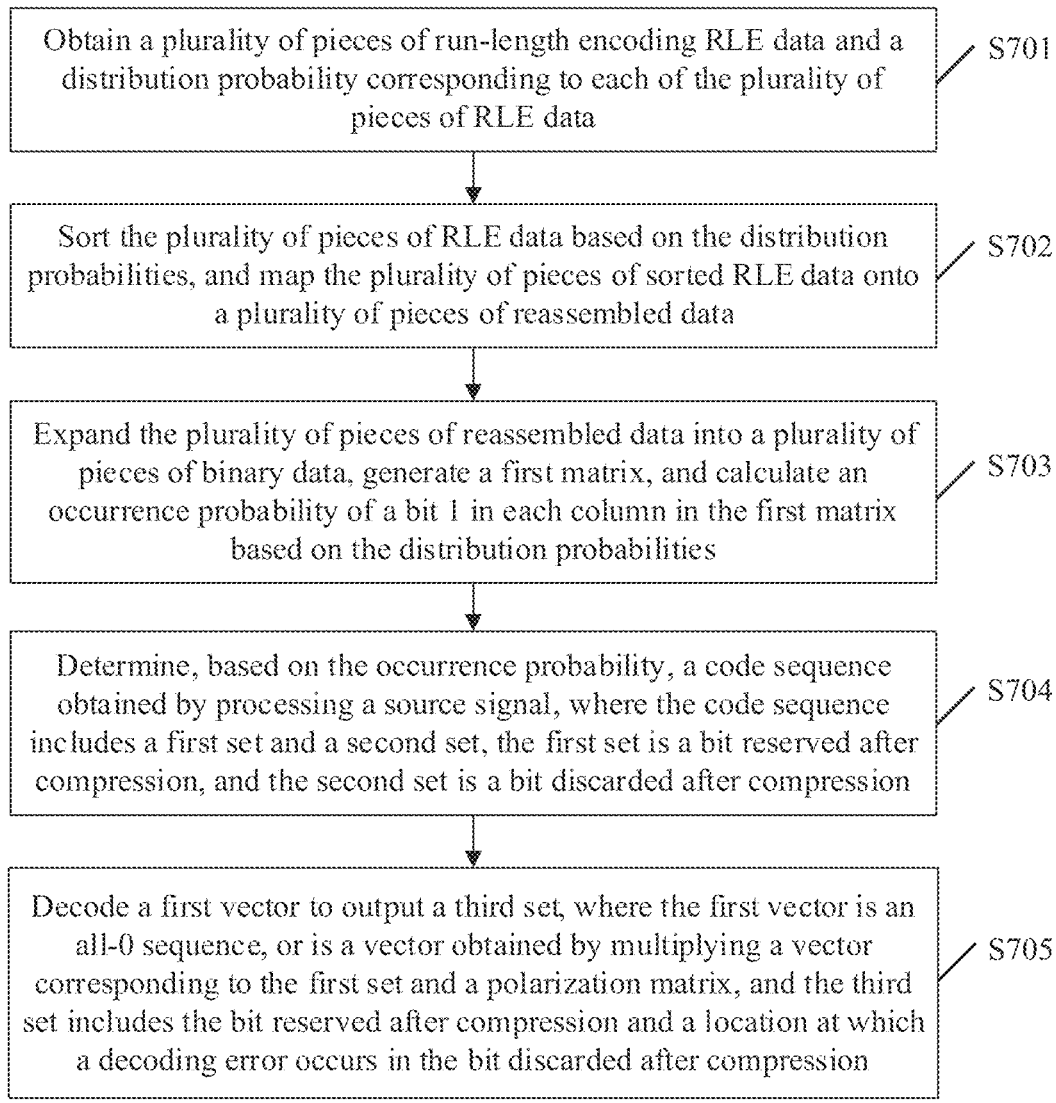
FIG. 7 is a schematic flowchart of a coding method according to an embodiment of this application.

FIG. 7 is a schematic flowchart of a coding method according to an embodiment of this application. Steps in this embodiment of this application include at least the following steps.

S701: Obtain a plurality of pieces of run-length encoding (RLE) data and distribution probabilities corresponding to the plurality of pieces of RLE data. Color transform, grayscale translation, 8×8 DCT transform, data quantization, zig-zag scanning, and run-length encoding may be performed on an original image to obtain a plurality of pieces of RLE data. For a specific method thereof, refer to the foregoing process. A dynamic range of the RLE data may be 0-255, and a distribution probability of each of 256 characters may be obtained by counting a quantity of occurrences of the character.

S702: Sort the plurality of pieces of RLE data based on the distribution probabilities, and map the plurality of pieces of sorted RLE data onto a plurality of pieces of reassembled data.

During specific implementation, the plurality of pieces of RLE data may be sorted in descending order of the distribution probabilities. Then, the plurality of pieces of sorted RLE data are mapped.

Figure 8:
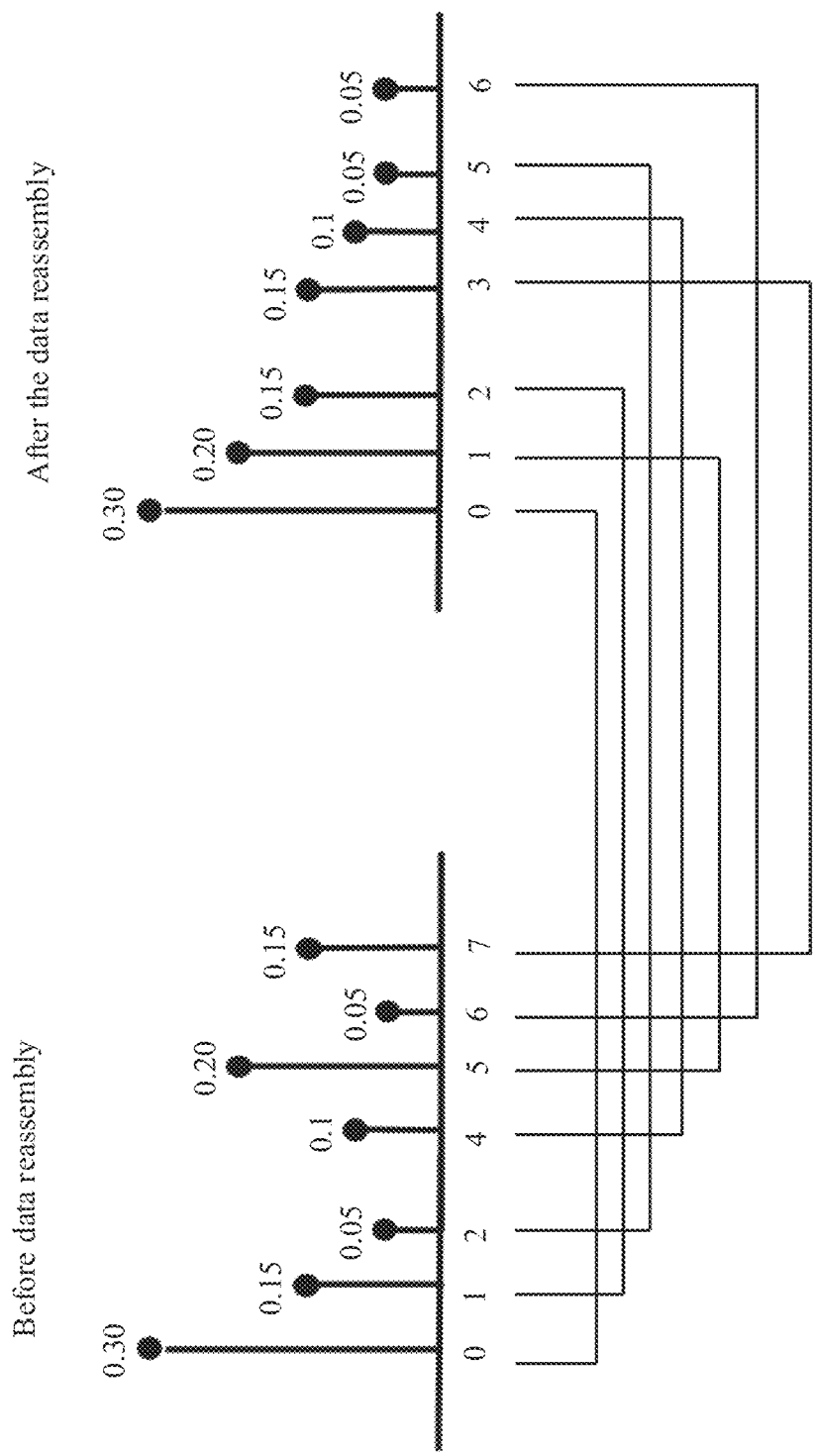
FIG. 8 is a schematic diagram of RLE data reassembly according to an embodiment of this application.

FIG. 8 is a schematic diagram of RLE data reassembly according to an embodiment of this application. A string of digit pairs (($N_1$, $a_1$), ($N_2$, $a_2$), ($N_3$, $a_3$), ($N_4$, $a_4$), ..., ($N_i$, $a_i$), ...) is obtained through run-length encoding, where $N_i$ represents a quantity of consecutive 0s before a digit $a_i$. N={0, 1, 2} (that is, a value of $N_i$ is 0, 1, or 2), and a represents a value of a non-0 element. The digit pairs are mapped onto a={0, 1, 2, 4, 5, 6, 7}, and calculated occurrence frequencies of {0, 1, 2, 4, 5, 6, 7} are {0.3, 0.15, 0.05, 0.1, 0.20, 0.05, 0.15}, respectively. Based on this, calculated discrete entropy of a source is 2.5710. During data reassembly, a probability set {0.30, 0.20, 0.15, 0.15, 0.1, 0.05, 0.05} in a right figure is obtained by sorting the distribution probabilities in descending order, and characters of {0.3, 0.2, 0.15, 0.15, 0.1, 0.05, 0.05} are listed from 0 to 6. In this case, a mapping relationship resulting from the reassembly is 0→0, 1→2, 2→5, 4→4, 5→1, 6→6, and 7→3.

S703: Expand the plurality of pieces of reassembled data into a plurality of pieces of binary data, generate a first matrix, and calculate an occurrence probability of a bit 1 in each column in the first matrix based on the distribution probabilities.

Because a binary polar code is used for compression, a plurality of pieces of reassembled data need to be represented by binary bits, and binary natural sequence expansion is performed on decimal numbers, that is, the plurality of pieces of reassembled data, ranging from 0 to 255, that is, a decimal number B is represented by a series $B=\Sigma_{i=0}^{7} b_i \cdot 2^{b_i}$, where $b_i=0, 1$. B may be uniquely represented by a sequence $b_7 b_6 b_5 b_4 b_3 b_2 b_1 b_0$, where $b_0$ is a least significant bit (LSB), and $b_7$ is a most significant bit (MSB). After the plurality of pieces of reassembled data are expanded into a plurality of pieces of binary data, a first matrix may be generated, where each row of data in the first matrix is corresponding to one piece of binary data. Layering may be performed based on each column of the first matrix to obtain a plurality of bit planes, the occurrence probability of 1 in each bit plane is calculated, and parallel layered compression of polar coding is completed based on the occurrence probabilities.

For example, as shown in FIG. 8, calculated occurrence frequencies of the plurality of pieces of RLE data, that is, a={0, 1, 2, 4, 5, 6, 7}, are {0.3, 0.15, 0.05, 0.1, 0.20, 0.05, 0.15}, respectively. The plurality of pieces of RLE data are mapped onto the plurality of pieces of reassembled data: 0→0, 1→2, 2→5, 4→4, 5→1, 6→6, and 7→3, and then the plurality of pieces of reassembled data are expanded into binary data. To be specific, {0, 1, 2, 3, 4, 5, 6} is represented by {'000', '001', '010', '011', '100', '101', '110'} and is respectively corresponding to the distribution probabilities (0.30, 0.20, 0.15, 0.15, 0.1, 0.05, 0.05), and the generated first matrix is $$\begin{bmatrix} 0 & 0 & 0 \\ 0 & 0 & 1 \\ 0 & 1 & 0 \\ 0 & 1 & 1 \\ 1 & 0 & 0 \\ 1 & 0 & 1 \\ 1 & 1 & 0 \end{bmatrix}$$

Then, the occurrence probability of a bit 1 in each column is calculated. The last three bits in the first column are 1, and an occurrence probability is 0.1+0.05+0.05=0.2; the third, fourth, and seventh bits in the second column are 1, and an occurrence probability is 0.15+0.15+0.05=0.35; and the second, fourth, and sixth bits in the third column are 1, and an occurrence probability is 0.2+0.15+0.05=0.4. In this case, the occurrence probabilities of a bit 1 in all the columns are {0.200, 0.3500, 0.400}. Each column can be considered as being obtained by generating 1 based on $q_i$ and generating 0 based on $(1-q_i)$ by using a Bernoulli source. The source is denoted as $Ber(q_i)$ for short.

To implement independent parallel compression, the $b_i$ sequence is directly compressed by without considering a correlation between $b_i$. In this case, independent entropy of each bit may be expressed as $H(b_i)=-q_i \log_2 q_i-(1-q_i) \log_2(1-q_i)$, where $q_i$ is a probability that $b_i$ is equal to 1. In this case, compression performance is a sum of independent entropy of 8 bits, that is $i_{i=0}^{7} H(b_i)$. According to a chain rule of entropy, the following relationship may be obtained:

$H(P)=H(b_7 b_6 b_5 b_4 b_3 b_2 b_1 b_0)=\Sigma_{i=0}^{7} H(b_i|b_{i-1} b_{i-2} \ldots b_0) \leq \Sigma_{i=0}^{7} H(b_i)$ If bits are not correlated with each other, $H(b_i|b_{i-1} b_{i-2} \ldots b_0)=H(b_i)$ holds true. It can be learnt that an effect of independent parallel compression is always worse than that of joint compression. To minimize a performance loss, the correlation between $b_i$ is expected to be as small as possible, and therefore the plurality of pieces of RLE data need to be reassembled.

Figure 9:
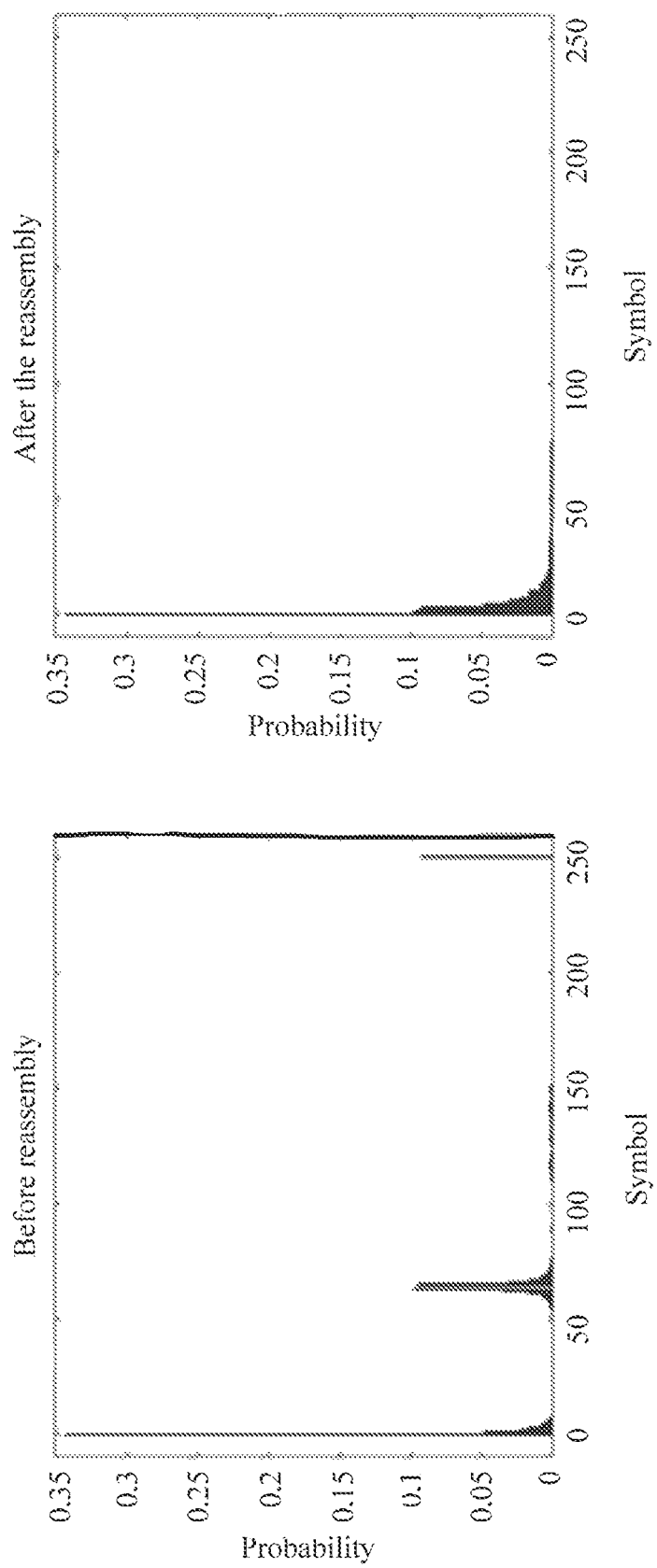
FIG. 9 is a schematic diagram of a distribution comparison before and after data reassembly according to an embodiment of this application.

FIG. 9 is a schematic diagram of a distribution comparison before and after data reassembly according to an embodiment of this application. As shown in a left figure of FIG. 9, a dynamic range of RLE data is 0-255, and a distribution probability of each of 256 characters may be obtained by counting a quantity of occurrences of the character. If reassembly and mapping are not performed on the plurality of pieces of RLE data, and binary natural number expansion is performed on the RLE data, that is, RLE data 0 is represented by '00000000', RLE data 1 is represented by '00000001', and so on, the obtained distribution correlation between $b_i$ is quite high. $\Sigma_{i=0}^{7} H(b_i)=6.22$ is obtained through calculation in the left figure, but actually $H(P)=4.10$, and in this case, there are two bits of redundancy. As shown in a right figure of FIG. 9, because sorting is performed in descending order of distribution probabilities, RLE data with a highest distribution probability is mapped onto 0, RLE data with a second highest distribution probability is mapped onto 1, and so on. RLE data with a higher distribution probability after the reassembly is distributed before RLE data with a lower distribution probability after the reassembly. After the reassembly and mapping are completed, binary expansion is finally performed on the plurality of pieces of reassembled data, to obtain independent entropy $i_{i=0}^{7} H(b_i)=4.36$ that is only 0.26 greater than the original $H(P)$. Therefore, a performance loss is greatly reduced through data reassembly.

S704: Determine, based on the occurrence probability, a code sequence obtained by processing a source signal, where the code sequence includes a first set and a second set, the first set is a bit reserved after compression, and the second set is a bit discarded after compression.

The first set is a bit whose polarized entropy approximates to 1 in the code sequence, and the second set is a bit whose polarized entropy approximates to 0 in the code sequence. Further, the polarized entropy is determined based on the occurrence probability.

Figure 10:
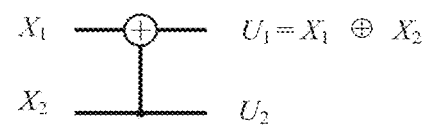
FIG. 10 is a schematic diagram of polar-code source polarization according to an embodiment of this application.

FIG. 10 is a schematic diagram of polar-code source polarization according to an embodiment of this application. It is assumed that $X_1$ and $X_2$ are two independent $Ber(q)$ sources, where source entropy of $Ber(q)$ sources is $H(X_1)=H(X_2)=H(q)=-q \log_2 q-(1-q) \log_2(1-q)$. Relationships $U_1=X_1 \ominus X_2$ and $U_2=X_2$ are obtained by using a polarization matrix $$\begin{bmatrix} 1 & 0 \\ 1 & 1 \end{bmatrix}.$$

Because the polarization matrix is an invertible matrix, a sum of entropy after the polarization operation remains unchanged, that is, $$H(X_1X_2)=H(U_1U_2)=H(U_1)+H(U_2|U_1)$$

Because $U_2=X_2$, $H(U_2|U_1) \leq H(X_2)=H(X_1)$. The sum of the entropy remains unchanged, and therefore $H(U_1) \geq H(X_1)$. It can be learnt that after the polarization operation is performed, the two independent and identically distributed Bernoulli sources become a source with greater source entropy and a source with smaller source entropy. This is a basic principle of source polarization.

If the foregoing process is repeated, the source entropy, that is, ($H(U_1)$ and $H(U_2|U_1)$), of the two independent and identically distributed sources is polarized in a next step, the source entropy may further be polarized. The polarization matrix in this case is $$G_N = \begin{bmatrix} 1 & 0 \\ 1 & 1 \end{bmatrix}^{\otimes n},$$

$\otimes$ is a tensor product, and the polarization process is implemented by using $U_N=X_N \times G_N$.

According to the chain rule of entropy $H(U_N)=\sum_{i=1}^{N} H(U_i|U_1^{i-1})$. Then, according to a source polarization theory, $H(U_i|U_1^{i-1})$ is continually polarized with an increase of N but falls within a range $0 \leq H(U_i|U_1^{i-1}) \leq 1$. When $N \to \infty$ in a limit case, $H(U_i|U_1^{i-1})$ is polarized to 1 or 0. Because of total entropy conservation, the following equation holds true:

$$H(U_N)=H(X_N)=NH(X)$$

A proportion $H(X)$ of parts that are 1 to polarized $H(U_i|U_1^{i-1})$ may be obtained, namely, $$\lim_{N\to\infty} \frac{|i \in [N] : H(U_i|U_1^{i-1}) = 1|}{N} =$$

$$H(X) \text{ and } \lim_{N\to\infty} \frac{|i \in [N] : H(U_i|U_1^{i-1}) = 1|}{N} = 1 - H(X).$$

In this way, compression of an $X_N$ signal can be converted to compression of $U_N$. Because $H(U_i|U_1^{i-1})=0$, some bits in $U_N$ may be entirely determined by other bits $U_1^{i-1}$ and may be discarded after compression. In this case, only the part $H(U_i|U_1^{i-1})=1$ needs to be saved. A set is set to $S=\{i \in [N]: H(U_i|U_1^{i-1}) \to 1\}$. A U sequence corresponding to the set is $U_S$, a complementary set of S is $S^c$, and in this case, $[U_S, U_{S^c}]=U_N$.

S705: Decode a first vector to output a third set, where the first vector is an all-0 sequence, or is a vector obtained by multiplying a vector corresponding to the first set and a polarization matrix, and the third set includes the bit reserved after compression and a location at which a decoding error occurs in the bit discarded after compression.

During specific implementation, decoding is performed based on a fixed bit set by using a polar decoder, to obtain an estimated value of the bit discarded after compression, where $Y^N=0^N$, $U_F=U_S$, $Y^N$ is a received signal of the polar decoder, that is, the first vector, $U_F$ is the fixed bit set, $U_S$ is the first set, and N is an integer greater than or equal to 1. Alternatively, decoding is performed based on a fixed bit set by using a polar decoder, to obtain an estimated value of the bit discarded after compression, where $Y^N=[U_F, 0_I]*G_N$, $U_F=0_F$, $Y^N$ is a received signal of the polar decoder, that is, the first vector, $G_N$ is the polarization matrix, $U_F$ is the fixed bit set, and N is an integer greater than or equal to 1.

Then, decoding may be performed to obtain the estimated value of the bit discarded after compression. When the estimated value is different from an original value of the bit discarded after compression, the estimated value is flipped, and the location at which a decoding error occurs in the bit discarded after compression is recorded. When the estimated value is equal to an original value of the bit discarded after compression, a next bit is decoded and checked. Data splicing is finally performed to complete a compression process.

Because $H(U_i|U_1^{i-1})$ corresponding to bits in $U_{S^c}$ approximates to 0, most of $U_i$ in $U_{S^c}$ can be obtained based on $U_1^{i-1}$. An estimated value $\hat{U}_i$ of $U_i$ may be derived from $U_1^{i-1}$ by using a principle similar to polar code decoding. If $\hat{U}_i$ is inconsistent with $U_i$, a location i needs to be recorded; otherwise, the location i does not need to be recorded. It is assumed that a polar code SC (successive cancellation) decoder is used to restore $U_{S^c}$ from $U_S$. Because N is a finite value, source polarization is incomplete, and there is a specific possibility of a decoding error. An error location is defined as T: $\{i \in S^c: \hat{U}_i^{SC} \neq U_i\}$, and $\hat{U}_i^{SC}$ represents the estimated value $U_i$ obtained through SC decoding. Obviously, when $N \to \infty$, a value proportion of the set T is $|T|/N \to 0$, and therefore a polar code achieves an optimal compression length $H(X)$. Same as coding, lossless compression decoding uses an SC polar decoder to restore $U_{S^c}$ from $U_S$. Because the decoding error location is known, the decoding result $\hat{U}_i^{SC}$ corresponding to i in T may be flipped to obtain the correct $U_i$. In this way, $U_N$ can be fully restored, thereby implementing lossless compression.

Figure 11:
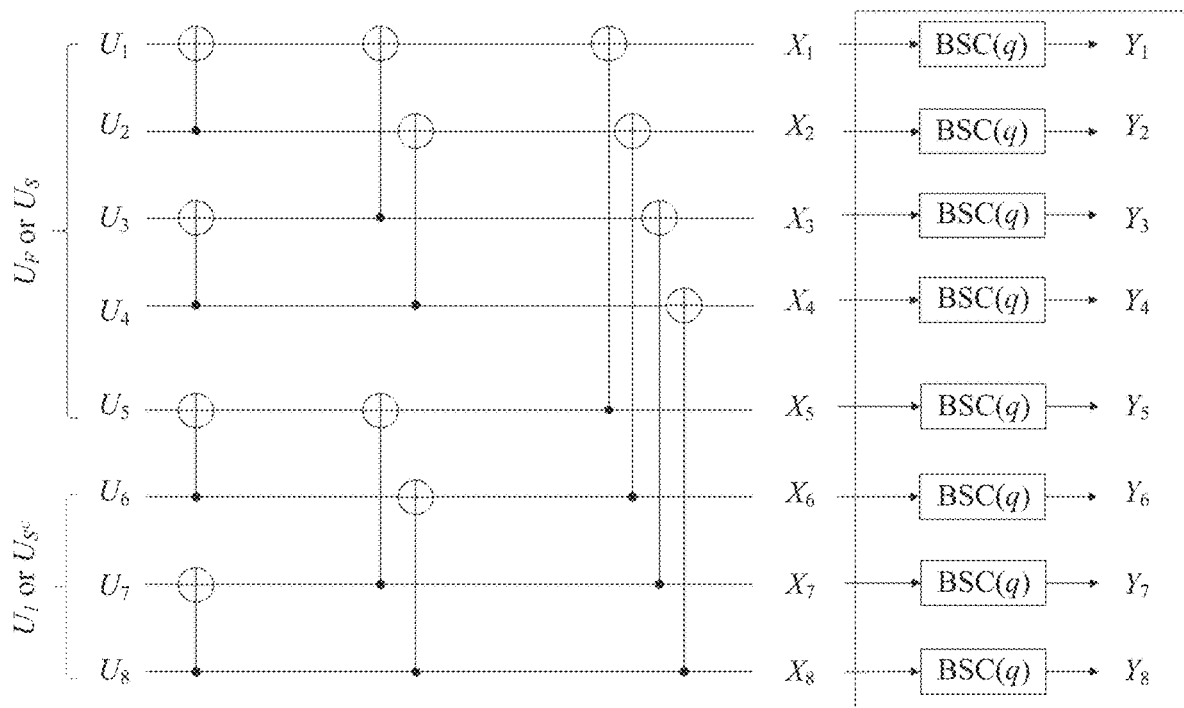
FIG. 11 is an equivalent schematic diagram of polar-code source compression and channel communication according to an embodiment of this application.

FIG. 11 is an equivalent schematic diagram of polar-code source compression and channel communication according to an embodiment of this application. A design of a lossless compression polar code for a Ber(q) source may be equivalent to a design of polar channel coding for a binary symmetric channel (BSC) (q).

Figure 12:
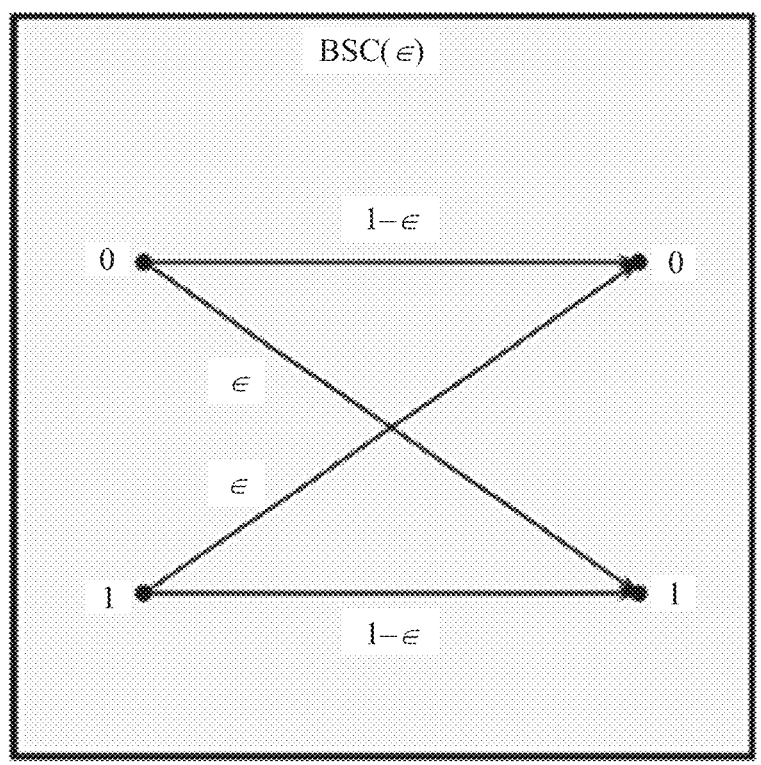
FIG. 12 is a schematic diagram of a BSC channel according to an embodiment of this application.

FIG. 12 is a schematic diagram of a BSC channel according to an embodiment of this application. An error probability of the BSC channel is $\in$. The channel parameter $\in$ is set to be the same as a Bernoulli source parameter, that is, $\in$=q. A channel capacity of BSC(q) may be calculated, that is, $1-H(q)=1+q \log_2 q+(1-q) \log_2(1-q)$, and is exactly complementary to $H(q)$. Specifically, a channel is set to $W=BSC(q)$, $n=\log_2 N$, and N polarized channels resulting from n times of polarization are represented by $\{i \in [N], W_N^{(i)}\}$. It can be theoretically proved that capacities of these polarized channels are complementary to the polarized source entropy, that is, $I(W_N^{(i)})=1-H(U_i|U_1^{i-1})$. A specific proof process is not described.

According to the channel polarization coding theory, a subchannel obtained through polarization is used to place an information bit, and a remaining subchannel is used to place a fixed bit. Then, an information bit set is defined as $I=\{i \in [N]: I(W_N^{(i)}) \to 1\}$ and a fixed bit set is defined as $F=I^c$. According to the foregoing complementary relationship, equivalent correspondences, that is, $U_F \leftrightarrow U_S$ and $U_I \leftrightarrow U_{S^c}$, may be obtained. Proportion relationships of the two parts are $$\frac{|U_S|}{N} \to H(q) \text{ and } \frac{|U_I|}{N} \to 1 - H(q).$$

Therefore, polar code construction sorting during source compression may be completely equivalent to a coding design for the BSC channel.

Polar code channel decoding may be used in a calculation process of source coding. Specifically, during source compression, whether the complementary set $U_{S^c}$ can be successfully decoded is checked when $U_S$ is given, and an error location is recorded if the error location exists, to implement lossless restoration. The polar code channel decoding process is a process of decoding $U_I$ based on the channel received signal $Y^N$ and the fixed bit set $U_F$. A typical polar code SC decoder, BP (belief propagation) decoder, and SCL (successive cancellation list) decoder can all implement the foregoing functions.

A difference between the correspondences, that is, $U_F \leftrightarrow U_S$ and $U_I \leftrightarrow U_{S^c}$, lies in that during polar channel encoding, $U_F$ is usually set to all 0s, while a value of $U_S$ during source compression is entirely determined by an output of the source $X^N$. In addition, during source compression, actually there is no channel output signal $Y^N$, and therefore a virtual channel output needs to be abstracted. For a channel model of BSC(q), a relationship between the input X and the output Y is $Y=X \oplus Z$, where $\oplus$ is a modulo 2 operation, Z is noise independent of X, and a probability that a value of Z is 1 is q, which is exactly a Bernoulli source Ber(q). If X is used as a source Ber(q) same as Z, that is, Y=0 is output, decoding of X is actually equivalent to restoration of the source Ber(q).

In conclusion, a BSC channel may be first abstracted, and noise of the BSC channel is completely identical to $X^N$, to obtain $Y^N=0^N$. A polar decoder may be used to correctly restore $U_I$ based on $Y^N$ and $U_F$, and $U_F$ may be set as a specific value of $U_S$. In this way, $U_I=U_{S^c}$ can be implemented. For example, an SC decoder is used, and $f^{SC}(-)$ is set to a polar code SC decoding function. In this case, $\hat{U}_{S^c}=\hat{U}_I=f^{SC}(Y^N=0^N, U_F=U_S)$. $U_F$ can be translated to include all 0s through linear transformation. In this way, an existing polar decoder can be directly used. Specifically, $$Y^N = X^N \oplus Z^N = 0^N$$

$$U^N G_N \oplus Z^N = Y^N = 0^N$$

$$[U_F, U_I]G_N \oplus Z^N = Y^N = 0^N$$

$[U_F, 0_I]G_N$ is added to both sides of the equation, and then $[0_F, U_I]G_N \oplus Z^N = Y^N = [U_F, 0_I]G_N$, which is equivalent to $\hat{U}_{S^c}=\hat{U}_I=f^{SC}(Y^N=[U_F, 0_I]G_N, U_F=0_F)$, is obtained. In this way, the existing polar decoder can be directly used. In addition, in the compression process, bit-by-bit comparison further needs to be performed on $\hat{U}_{S^c}$ and the original $U_{S^c}$. If there is a different bit, an error location is recorded, $\hat{U}_i$ of the bit is flipped, and bit-by-bit comparison continues to be performed for a next bit.

Figure 13:
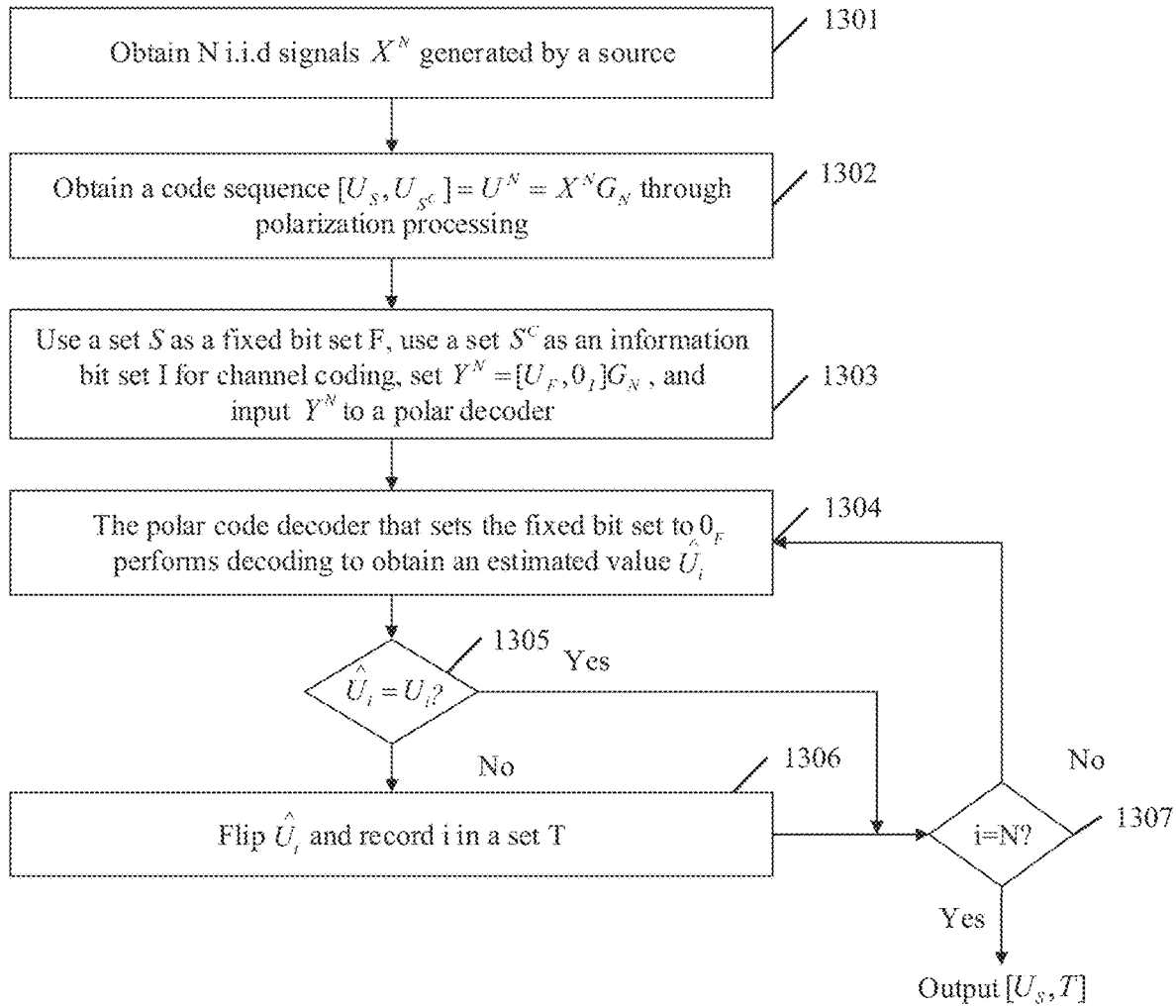
FIG. 13 is a schematic flowchart of lossless polar compression according to an embodiment of this application.

For example, FIG. 13 is a schematic flowchart of lossless polar compression according to an embodiment of this application. 1301: Obtain N independent and identically distributed (i.i.d) signals $X^N$ generated by a source. 1302: Obtain a code sequence $[U_S, U_{S^c}]=U^N=X^N G_N$ through polarization processing, where $G_N$ is a polarization matrix. 1303: Use a set S as a fixed bit set F, use a set $S^C$ as an information bit set I for channel coding, set $Y^N=[U_F, 0_I]G_N$, and input $Y^N$ to a polar decoder. 1304: The polar decoder that sets the fixed bit set to $0_F$ performs decoding to obtain an estimated value $\hat{U}_i$, where $i \in I$. 1305: Determine whether $\hat{U}_i=U_i$ holds true, and if $\hat{U}_i=U_i$ does not hold true, perform step 1306; or if $\hat{U}_i=U_i$ holds true, perform step 1307. 1306: Flip $\hat{U}_i$ and record i in a set T. 1307: Determine whether i is equal to N, and if i is equal to N, output $[U_S, T]$; or i is not equal to N, check a next bit.

In this embodiment of this application, color transform, grayscale translation, DCT transform, data quantization, zig-zag scanning, and run-length encoding are performed on image data to obtain RLE data, the RLE data is reassembled, reassembled RLE data is converted into a multi-bit binary bit sequence, and finally a polar code is designed to perform parallel compression on a signal of each bit plane. This increases a compression throughput of the polar code and implements fast lossless compression of parallel polar coding.

Figure 14:
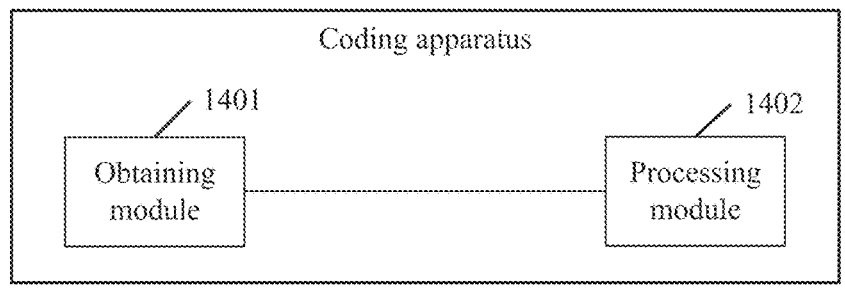
FIG. 14 is a schematic diagram of a coding apparatus according to an embodiment of this application.

FIG. 14 is a schematic diagram of a coding apparatus according to an embodiment of this application. The apparatus in this embodiment of this application includes at least an obtaining module 1401 and a processing module 1402.

The obtaining module 1401 is configured to obtain a plurality of pieces of run-length encoding (RLE) data and distribution probabilities corresponding to the plurality of pieces of RLE data;

the processing module 1402 is configured to: sort the plurality of pieces of RLE data based on the distribution probabilities, and map the plurality of pieces of sorted RLE data onto a plurality of pieces of reassembled data;

the processing module 1402 is further configured to: expand the plurality of pieces of reassembled data into a plurality of pieces of binary data, generate a first matrix, and calculate an occurrence probability of a bit 1 in each column in the first matrix based on the distribution probabilities;

the processing module 1402 is further configured to determine, based on the occurrence probability, a code sequence obtained by processing a source signal, where the code sequence includes a first set and a second set, the first set is a bit reserved after compression, and the second set is a bit discarded after compression; and the processing module 1402 is further configured to decode a first vector to output a third set, where the first vector is an all-0 sequence, or is a vector obtained by multiplying a vector corresponding to the first set and a polarization matrix, and the third set includes the bit reserved after compression and a location at which a decoding error occurs in the bit discarded after compression.

The first set is a bit whose polarized entropy approximates to 1 in the code sequence, and the second set is a bit whose polarized entropy approximates to 0 in the code sequence.

The polarized entropy is determined based on the occurrence probability.

Optionally, the processing module 1402 is further configured to perform decoding based on a fixed bit set by using a polar decoder, to obtain an estimated value of the bit discarded after compression, where $Y^N=0^N$, $U_F=U_S$, $Y^N$ is a received signal of the polar decoder, $U_F$ is the fixed bit set, $U_S$ is the first set, and N is an integer greater than or equal to 1.

Optionally, the processing module 1402 is further configured to perform decoding based on a fixed bit set by using a polar decoder, to obtain an estimated value of the bit discarded after compression, where $Y^N=[U_F, 0_I]*G_N$, $U_F=0_F$, $Y^N$ is a received signal of the polar decoder, $U_F$ is the fixed bit set, $G_N$ is the polarization matrix, and N is an integer greater than or equal to 1.

Optionally, the processing module 1402 is further configured to: when the estimated value is different from an original value of the bit discarded after compression, flip the estimated value, and record the location at which a decoding error occurs in the bit discarded after compression.

Optionally, the processing module 1402 is further configured to sort the plurality of pieces of RLE data in descending order of the distribution probabilities.

Optionally, the processing module 1402 is further configured to: perform layering based on each column of the first matrix to obtain a plurality of bit planes, and calculate the occurrence probability of 1 in each bit plane.

It should be noted that for implementation of each module, refer to corresponding description of the method embodiment shown in FIG. 7, to perform the method and the function in the foregoing embodiment.

Figure 15:
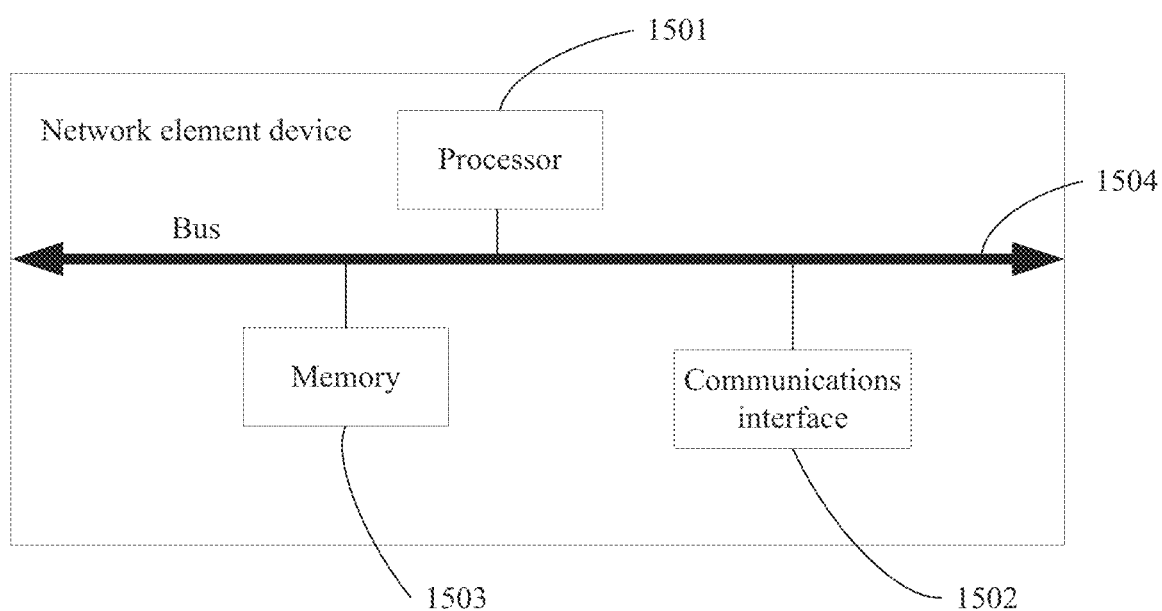
FIG. 15 is a schematic diagram of a structure of a network element device according to an embodiment of this application.

FIG. 15 is a schematic diagram of a structure of a network element device according to an embodiment of this application. As shown in FIG. 15, the network element device may include at least one processor 1501, at least one communications interface 1502, at least one memory 1503, and at least one communications bus 1504.

The processor 1501 may be a central processing unit, a general purpose processor, a digital signal processor, an application-specific integrated circuit, a field programmable gate array or another programmable logic device, a transistor logic device, a hardware component, or any combination thereof. The processor 1501 may implement or execute various example logical blocks, modules, and circuits described with reference to content disclosed in this application. Alternatively, the processor may be a combination of processors implementing a computing function, for example, a combination including one or more microprocessors, or a combination of a digital signal processor and a microprocessor. The communications bus 1504 may be a peripheral component interconnect (PCI) bus, an extended industry standard architecture (EISA) bus, or the like. The bus may be classified into an address bus, a data bus, a control bus, and the like. For ease of representation, the bus in FIG. 15 is represented by only one thick line, but this does not mean that there is only one bus or only one type of bus. The communications bus 1504 is configured to implement connection and communication between these components. The communications interface 1502 of the device in this embodiment of this application is configured to perform signaling or data communication with another node device. The memory 1503 may include a volatile memory, for example, a dynamic random access memory (DRAM), a phase-change random access memory (PRAM), or a magnetoresistive random access memory (MRAM). The memory 1503 may further include a nonvolatile memory, for example, at least one magnetic disk storage device, an electrically erasable programmable read-only memory (EEPROM), a flash memory device such as a NOR flash memory or a NAND flash memory, or a semiconductor device such as a solid-state drive (SSD). Optionally, the memory 1503 may be at least one storage apparatus far away from the processor 1501. Optionally, the memory 1503 may further store a set of program code, and optionally, the processor 1501 may further execute a program stored in the memory 1503.

The communications interface 1502 is configured to obtain a plurality of pieces of run-length encoding (RLE) data and distribution probabilities corresponding to the plurality of pieces of RLE data;

the processor 1501 is configured to: sort the plurality of pieces of RLE data based on the distribution probabilities, and map the plurality of pieces of sorted RLE data onto a plurality of pieces of reassembled data;

the processor 1501 is further configured to: expand the plurality of pieces of reassembled data into a plurality of pieces of binary data, generate a first matrix, and calculate an occurrence probability of a bit 1 in each column in the first matrix based on the distribution probabilities;

the processor 1501 is further configured to determine, based on the occurrence probability, a code sequence obtained by processing a source signal, where the code sequence includes a first set and a second set, the first set is a bit reserved after compression, and the second set is a bit discarded after compression; and the processor 1501 is further configured to decode a first vector to output a third set, where the first vector is an all-0 sequence, or is a vector obtained by multiplying a vector corresponding to the first set and a polarization matrix, and the third set includes the bit reserved after compression and a location at which a decoding error occurs in the bit discarded after compression.

The first set is a bit whose polarized entropy approximates to 1 in the code sequence, and the second set is a bit whose polarized entropy approximates to 0 in the code sequence.

The polarized entropy is determined based on the occurrence probability.

Optionally, the processor 1501 is further configured to perform the following operation:

performing decoding based on a fixed bit set by using a polar decoder, to obtain an estimated value of the bit discarded after compression, where $Y^N=0^N$, $U_F=U_S$, $Y^N$ is a received signal of the polar decoder, $U_F$ is the fixed bit set, $U_S$ is the first set, and N is an integer greater than or equal to 1.

Optionally, the processor 1501 is further configured to perform the following operation:

performing decoding based on a fixed bit set by using a polar decoder, to obtain an estimated value of the bit discarded after compression, where $Y^N [U_F, 0_I]*G_N$, $U_F=0_F$, $Y^N$ is a received signal of the polar decoder, $U_F$ is the fixed bit set, $G_N$ is the polarization matrix, and N is an integer greater than or equal to 1.

Optionally, the processor 1501 is further configured to perform the following operations:

when the estimated value is different from an original value of the bit discarded after compression, flipping the estimated value, and recording the location at which a decoding error occurs in the bit discarded after compression.

Optionally, the processor 1501 is further configured to perform the following operation:

sorting the plurality of pieces of RLE data in descending order of the distribution probabilities.

Optionally, the processor 1501 is further configured to perform the following operations:

performing layering based on each column of the first matrix to obtain a plurality of bit planes, and calculating the occurrence probability of 1 in each bit plane.

Further, the processor may further cooperate with the memory and the communications interface to perform operations of the network element device in the foregoing embodiments of this application.

An embodiment of this application further provides a processor. The processor is coupled to a memory, and is configured to perform any method and function that are related to the network element device in the foregoing embodiment.

An embodiment of this application further provides a computer program product including instructions. When the computer program product runs on a computer, the computer is enabled to perform any method and function that are related to the network element device in the foregoing embodiment.

An embodiment of this application further provides an apparatus, configured to perform any method and function that are related to the network element device in the foregoing embodiment.

All or some of the foregoing embodiments may be implemented by software, hardware, firmware, or any combination thereof. When software is used to implement the embodiments, all or some of the foregoing embodiments may be implemented in a form of a computer program product. The computer program product includes one or more computer instructions. When the computer instructions are loaded and executed on a computer, the procedure or functions according to the embodiments of this application are completely or partially generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

The objectives, technical solutions, and beneficial effects of this application are further described in detail in the foregoing specific implementations. Any modification, equivalent replacement, improvement, or the like made without departing from the spirit and principle of this application shall fall within the protection scope of this application.

What is claimed is:

1. A coding method, wherein the method comprises:
    obtaining a plurality of pieces of run-length encoding (RLE) data and a plurality of distribution probabilities corresponding to the plurality of pieces of RLE data;
    sorting the plurality of pieces of RLE data based on the plurality of distribution probabilities;
    mapping the plurality of pieces of sorted RLE data onto a plurality of pieces of reassembled data;
    expanding the plurality of pieces of reassembled data into a plurality of pieces of binary data;
    generating a first matrix based on the plurality of pieces of binary data;
    calculating an occurrence probability of a bit 1 in each column in the first matrix based on the plurality of distribution probabilities;
    determining, based on the occurrence probability, a code sequence by processing a source signal, wherein the code sequence comprises a first set and a second set, the first set comprises one or more bits reserved after processing the source signal, and the second set comprises one or more bits discarded after processing the source signal; and
    decoding a first vector to output a third set, wherein the first vector is an all-0 sequence, or a vector obtained by multiplying a vector corresponding to the first set and a polarization matrix, and the third set comprises the one or more bits reserved after processing the source signal and one or more locations at which a decoding error occurs in the one or more bits discarded after processing the source signal.

2. The method according to claim 1, wherein the first set comprises one or more bits with each bit having a polarized entropy approximating to 1 in the code sequence, and the second set comprises one or more bits with each bit having a polarized entropy approximating to 0 in the code sequence.

3. The method according to claim 2, wherein the polarized entropy is determined based on the occurrence probability.

4. The method according to claim 1, wherein decoding the first vector to output the third set comprises:
    decoding based on a fixed bit set by using a polar decoder, to obtain an estimated value of the bit discarded after processing the source signal, wherein $Y^N=0^N$, $U_F=U_S$, $Y^N$ is a received signal of the polar decoder, $U_F$ is the fixed bit set, $U_S$ is the first set, and N is an integer greater than or equal to 1.

5. The method according to claim 1, wherein decoding the first vector to output the third set comprises:
    decoding based on a fixed bit set by using a polar decoder, to obtain an estimated value of the bit discarded after processing the source signal, wherein $Y^N=[U_F, 0_I]*G_N$, $U_F=0_F$, $Y^N$ is a received signal of the polar decoder, $U_F$ is the fixed bit set, $U_S$ is the polarization matrix, and N is an integer greater than or equal to 1.

6. The method according to claim 4, wherein decoding the first vector to output the third set comprises:
    determining that the estimated value is different from an original value of the bit discarded after processing the source signal;
    flipping the estimated value; and
    recording the one or more locations at which a decoding error occurs in the one or more bits discarded after processing the source signal.

7. The method according to claim 1, wherein sorting the plurality of pieces of RLE data based on the plurality of distribution probabilities comprises:
    sorting the plurality of pieces of RLE data in a descending order of the plurality of distribution probabilities.

8. The method according to claim 1, wherein calculating the occurrence probability of a bit 1 in each column in the first matrix based on the plurality of distribution probabilities comprises:
    performing layering based on each column of the first matrix to obtain a plurality of bit planes, and calculating the occurrence probability of a bit 1 in each bit plane.

9. A coding apparatus, wherein the apparatus comprises:
    at least one processor; and
    one or more non-transitory memories, coupled to the at least one processor and storing computer-readable instructions that when executed by the at least one processor, cause the coding apparatus to perform operations comprising:
    obtaining a plurality of pieces of run-length encoding (RLE) data and a plurality of distribution probabilities corresponding to the plurality of pieces of RLE data;
    sorting the plurality of pieces of RLE data based on the plurality of distribution probabilities;
    mapping the plurality of pieces of sorted RLE data onto a plurality of pieces of reassembled data;

expanding the plurality of pieces of reassembled data into a plurality of pieces of binary data;
generating a first matrix based on the plurality of pieces of binary data;
calculating an occurrence probability of a bit 1 in each column in the first matrix based on the plurality of distribution probabilities;
determining, based on the occurrence probability, a code sequence by processing a source signal, wherein the code sequence comprises a first set and a second set, the first set comprises one or more bits reserved after processing the source signal, and the second set comprises one or more bits discarded after processing the source signal; and
decoding a first vector to output a third set, wherein the first vector is an all-0 sequence, or is a vector obtained by multiplying a vector corresponding to the first set and a polarization matrix, and the third set comprises the one or more bits reserved after processing the source signal and one or more locations at which a decoding error occurs in the one or more bits discarded after processing the source signal.

10. The apparatus according to claim 9, wherein the first set comprises one or more bits with each bit having a polarized entropy approximating to 1 in the code sequence, and the second set comprises one or more bits with each bit having a polarized entropy approximating to 0 in the code sequence.

11. The apparatus according to claim 10, wherein the polarized entropy is determined based on the occurrence probability.

12. The apparatus according to claim 9, wherein decoding the first vector to output the third set comprises:
decoding based on a fixed bit set by using a polar decoder, to obtain an estimated value of the bit discarded after processing the source signal, wherein $Y^N=0^N$, $U_F=U_S$, $Y^N$ is a received signal of the polar decoder, $U_F$ is the fixed bit set, $U_S$ is the first set, and N is an integer greater than or equal to 1.

13. The apparatus according to claim 9, wherein decoding the first vector to output the third set comprises:
decoding based on a fixed bit set by using a polar decoder, to obtain an estimated value of the bit discarded after processing the source signal, wherein $Y^N=[U_F, 0_I]*G_N$, $U_F=0_F$, $Y^N$ is a received signal of the polar decoder, $U_F$ is the fixed bit set, $G_N$ is the polarization matrix, and N is an integer greater than or equal to 1.

14. The apparatus according to claim 12, wherein decoding the first vector to output the third set comprises: determining that the estimated value is different from an original value of the bit discarded after processing the source signal, flipping the estimated value, and recording the one or more locations at which a decoding error occurs in the one or more bits discarded after processing the source signal.

15. The apparatus according to claim 9, wherein sorting the plurality of pieces of RLE data based on the plurality of distribution probabilities comprises:
sorting the plurality of pieces of RLE data in a descending order of the plurality of distribution probabilities.

16. The apparatus according to claim 9, wherein calculating the occurrence probability of a bit 1 in each column in the first matrix based on the plurality of distribution probabilities comprises:
performing layering based on each column of the first matrix to obtain a plurality of bit planes, and calculate the occurrence probability of a bit 1 in each bit plane.

17. A non-transitory computer-readable storage medium, wherein the non-transitory computer-readable storage medium stores instructions that when executed on a computer, cause the computer to perform operations comprising:
obtaining a plurality of pieces of run-length encoding (RLE) data and a plurality of distribution probabilities corresponding to the plurality of pieces of RLE data;
sorting the plurality of pieces of RLE data based on the plurality of distribution probabilities;
mapping the plurality of pieces of sorted RLE data onto a plurality of pieces of reassembled data;
expanding the plurality of pieces of reassembled data into a plurality of pieces of binary data;
generating a first matrix based on the plurality of pieces of binary data;
calculating an occurrence probability of a bit 1 in each column in the first matrix based on the plurality of distribution probabilities;
determining, based on the occurrence probability, a code sequence by processing a source signal, wherein the code sequence comprises a first set and a second set, the first set is one or more bits reserved after processing the source signal, and the second set is one or more bits discarded after processing the source signal; and
decoding a first vector to output a third set, wherein the first vector is an all-0 sequence, or is a vector obtained by multiplying a vector corresponding to the first set and a polarization matrix, and the third set comprises the one or more bits reserved after processing the source signal and one or more locations at which a decoding error occurs in the one or more bits discarded after processing the source signal.

18. The non-transitory computer-readable storage medium according to claim 17, wherein the first set comprises one or more bits with each bit having a polarized entropy approximating to 1 in the code sequence, and the second set comprises one or more bits with each bit having a polarized entropy approximating to 0 in the code sequence.

19. The non-transitory computer-readable storage medium according to claim 18, wherein the polarized entropy is determined based on the occurrence probability.

20. The non-transitory computer-readable storage medium according to claim 17, wherein decoding the first vector to output the third set comprises:
decoding based on a fixed bit set by using a polar decoder, to obtain an estimated value of the bit discarded after processing the source signal, wherein $Y^N=0^N$, $U_F=U_S$, $Y^N$ is a received signal of the polar decoder, $U_F$ is the fixed bit set, $U_S$ is the first set, and N is an integer greater than or equal to 1.

* * * * *

UNITED STATES PATENT AND TRADEMARK OFFICE
CERTIFICATE OF CORRECTION

PATENT NO. : 12,010,352 B2
APPLICATION NO. : 17/584726
DATED : June 11, 2024
INVENTOR(S) : Ling Liu et al.

It is certified that error appears in the above-identified patent and that said Letters Patent is hereby corrected as shown below:

In the Claims

In Column 16, In Line 30, In Claim 5, delete "$U_S$" and insert -- $G_N$ --.

Signed and Sealed this
Fifth Day of November, 2024

Katherine Kelly Vidal
*Director of the United States Patent and Trademark Office*